United States Patent [19]
Krivanek

[11] Patent Number: 4,831,255
[45] Date of Patent: May 16, 1989

[54] VARIABLE-ATTENUATION PARALLEL DETECTOR

[75] Inventor: Ondrej L. Krivanek, Oakland, Calif.

[73] Assignee: Gatan, Inc., Pleasanton, Calif.

[21] Appl. No.: 160,016

[22] Filed: Feb. 24, 1988

[51] Int. Cl.[4] .............................................. G01T 1/36
[52] U.S. Cl. .................................. 250/305; 250/397; 250/306
[58] Field of Search ................... 250/397, 311, 492.3, 250/306, 336.1, 305, 492 B

[56] References Cited

U.S. PATENT DOCUMENTS

| | | | |
|---|---|---|---|
| 3,096,437 | 7/1963 | Murray | 250/41.9 |
| 3,600,573 | 8/1971 | Watanabe | 250/41.9 |
| 3,777,159 | 12/1973 | Hammond et al. | 250/397 |
| 4,189,641 | 2/1980 | Katagiri | 250/311 |
| 4,724,321 | 2/1988 | Edlin et al. | 250/336.1 |
| 4,764,674 | 8/1988 | Kinoshita | 250/397 |

OTHER PUBLICATIONS

Shuman H., "Quantitative Data Processing of Parallel-Recorded ... ", Rev. Sci. Instr. 56, 231(1985).
Bourdillon A. J. et al., "A Dual Parallel and Serial Detection ... ", Inst. Phys. Conf. Ser. 78, 161(1985).

Primary Examiner—Bruce C. Anderson
Assistant Examiner—Michael Aronoff

[57] ABSTRACT

An electron beam attenuator decreases the intensity of an electron beam incident on a parallel electron detector by alternately deflecting the electron beam onto and away from the detector. A power supply controlling the attenuator is synchronized with the operation of the detector such that the electron beam only strikes the detector when the detector is not being read-out. The ratio of the time that the electron beam is incident on the detector to the time that the beam is off the detector is varied to give an adjustable attenuation of the detected electron signal. The intensity of the electron beam incident on the detector is monitored by a sensor separate from the parallel detector. When the beam intensity exceeds a pre-determined threshold, the attenuator is automatically activated, in order to prevent damage to the detector.

10 Claims, 6 Drawing Sheets ns of electrons and, more particularly, to an apparatus for attenuating the intensity of an electron beam incident on the detector in an electron energy loss spectrometer.

VARIABLE-ATTENUATION PARALLEL DETECTOR

BACKGROUND OF THE INVENTION

1. Field of the Invention

The invention relates to parallel detectors of electrons and, more particularly, to an apparatus for attenuating the intensity of an electron beam incident on the detector in an electron energy loss spectrometer.

2. Description of Prior Art

When a beam of high energy electrons traverses a thin sample, the electrons experience various energy losses, typically in the range of 10 to 3000 eV, which are characteristic of the chemical composition of the sample. The energy losses can be analyzed by an electron energy-loss spectrometer. If such a spectrometer is attached to a transmission electron microscope capable of illuminating an extremely small part of a thin sample with an intense electron beam, the combined instrument can analyze the composition of amounts of matter consisting of as little as 10 atoms. Because the irradiating electron beam irreparably damages the thin sample, it is important that the energy loss spectrum be detected with the highest possible efficiency, particularly at energy losses greater than about 100 eV, where the intensity of the electron energy-loss spectrum is usually weak. On the other hand, it is also important that the detector be able to faithfully record the intensity profile of the more intense low energy losses ranging from about 10 eV to 100 eV energy loss, and also of the zero-loss peak, whose intensity is typically $10^6$ to $10^9$ times higher than the intensity of the highest energy losses of interest. Further, it is desirable that the intense zero loss peak never be allowed to rest upon the detector for an extended time period in order to avoid radiation damage to the detector.

A particularly efficient apparatus for detecting the electron energy-loss spectrum is a detector consisting of a large number of elements which detect a major portion of the spectrum simultaneously. Such detectors are typically called parallel (or multi-channel) detectors of electrons, and electron energy-loss spectrometers employing such detectors are known as parallel-detection electron energy-loss spectrometers. Prior-art parallel detectors used in parallel-detection electron energy-loss spectrometers typically employ a one-dimensional or two-dimensional detector such as a photodiode array, a charge-coupled device array, or a TV camera, and are either directly exposed to the electron beam, or the electron beam is converted into a light image which is optically coupled to the detector. These parallel detectors can typically detect an electron energy-loss spectrum consisting of 512 or 1024 independent channels simultaneously, and can be optimized to detect single incident electrons. However, the dynamic range of the prior-art parallel detectors is typically only $10^2$ to $10^5$, so that when they are optimized for detecting single electrons, they become hopelessly saturated by the intense zero loss peak.

In order to be able to detect the weak high energy losses as well as the intense zero loss peak, a known parallel detector for an electron energy-loss spectrometer employs two adjacent electron detectors, with one detector optimized for high sensitivity, and the other for ability to handle intense electron beams. The detector also comprises a deflecting dipole which directs the dispersed electron energy-loss spectrum to either one or the other detector according to which part of the spectrum is being studied. Apart from the disadvantage of added complexity of two whole detection systems are compared to one, this design also causes the spectrum to become slightly defocused when deflected from one detector to the other, which necessitates a tedious readjustment of focus each time the detectors are switched. In another known parallel detector, an intensifier with variable gain is inserted between an electron scintillator and a light detector, and the gain of the intensifier is adjusted according to the intensity of the part of the electron energy-loss spectrum being studied. This design results in simplified construction and operation, but the insertion of the intensifier typically degrades the resolution of the detector, and non-uniformities in the gain of the intensifier cause the gains of different detector channels to become different from each other.

A further major disadvantage of the known parallel detectors is that when studying the intensity profile of the intense zero loss peak, the detector is continuously exposed to a high flux of oncoming electrons. The accumulated high dose typically causes radiation damage in the detector, requiring a costly replacement of the detector.

SUMMARY OF THE INVENTION

It is an object of the present invention to eliminate the inadequacies of the known parallel detectors of electrons by creating a variable attenuator of the electron beam incident upon the detector, and by providing a means of preventing the possibility of the parallel detector being continuously exposed to the intense zero loss peak.

According to the invention, an electron deflector is interposed between a device dispersing an electron beam into an energy spectrum, and a parallel electron detector. The power supply energizing the deflector causes it to alternately deflect the electron energy-loss spectrum onto the active area of the detector, and to deflect the spectrum away from the active area of the detector. By varying the ratio of the time the spectrum is incident on the detector to the time that the spectrum is deflected away, a variable attenuation of the spectrum is achieved. When studying weak high energy electron losses, the attenuator is typically switched off and the spectrum is kept continuously on the detector. When studying the profile of the intense low losses or the very intense zero-loss peak, the attenuator is switched on and the spectrum is mostly kept away from the detector. Provision is also made for the sensing of the intensity of the electron beam incident on the parallel detector, and for automatically deflecting the beam away from the detector whenever the intensity of the beam exceeds a pre-determined threshold, so as to avoid radiation damage to the detector.

A major advantage of the present invention is that the same detector is used for both the weak high energy losses as for the intense zero-loss peak, which results in simplified construction and operation of the detector, and in particular it avoids the need to refocus the spectrum depending on which part of the spectrum is being studied. Another advantage of the present invention is that it does not require the use of an intensifier of variable gain interposed in front of the detector, so that the loss of detector resolution and the increased channel-tochannel gain variation which such an intensifier would cause is avoided.

A further major advantage of the invention is that when the attenuator is on, the time interval that the spectrum is incident on the detector is usually shorter than the time constant of instrumental instabilities which normally deteriorate the energy resolution of the spectrometer. This results in improved energy resolution of the spectrometer.

Yet another major advantage of the present invention is that it does not allow the intense zero loss peak to rest on the active area of the detector for an extended period of time. This results in the avoidance of severe radiation damage of the detector, thereby prolonging the useful life of the detector.

BROAD DESCRIPTION OF THE DRAWINGS

For a better understanding of the present invention, reference may be had to the following detailed description taken with the accompanying drawings in which:

FIG. 7 shows the same electron energy-loss spectrum as FIG. 6, but acquired with the attenuator switched on.

Figure 1:
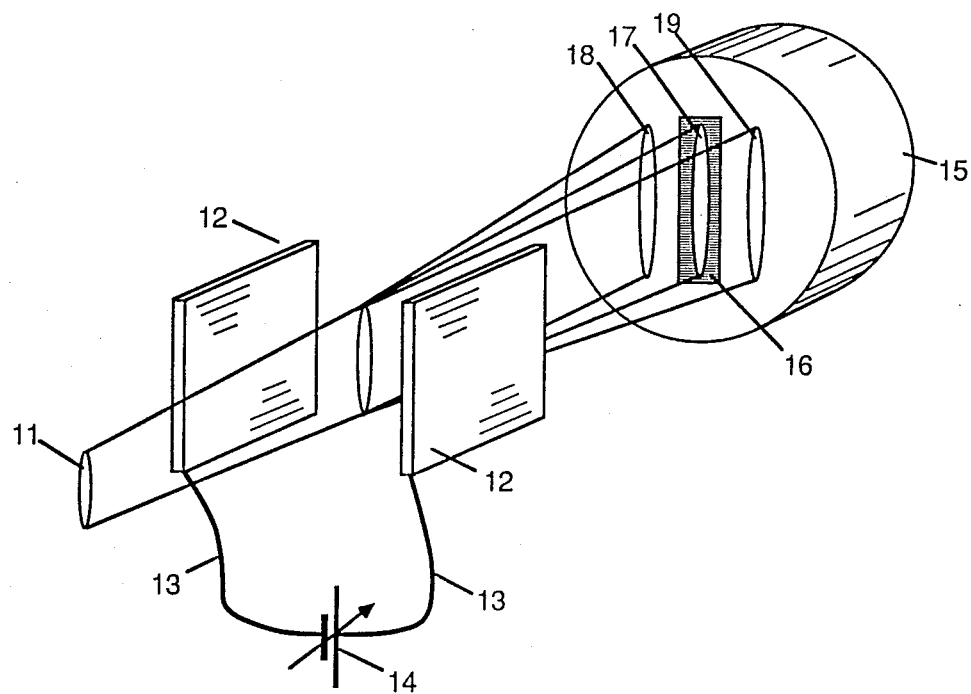
FIG. 1 shows a perspective view of an electron beam attenuator for a parallel electron detector according to the present invention, in which the deflector is a pair of electrostatic deflecting plates.

DRAWING REFERENCE NUMERALS 11 dispersed electron beam
12 electrostatic deflector
13 electrical lead
14 power supply
15 parallel detector
16 active area of parallel detector
17 undeflected spectrum
18 deflected spectrum
19 deflected spectrum
20 coil
21 power supply
30 accumulation phase
31 read-out phase
32 end-of-read pulse
33 voltage (or current) applied to deflector
34 threshold voltage (or current)
35 threshold voltage (or current)
36 active periods of detector
40 displacement of the spectrum on the detector in the dispersion direction
50 electron shield
51 conductive coating
52 electron scintillator
53 fiber-optic face-plate
54 conducting sleeve
55 insulating sleeve
56 "O"-ring
57 wall
58 light detector
59 electrical lead
60 current amplifier
61 low-loss spectrum
62 saturation level
63 low-loss spectrum

DETAILED DESCRIPTION OF THE PREFERRED EMBODIMENTS

Referring to FIG. 1, the electron beam attenuator for a parallel electron detector comprises an electron deflector 12, a power supply 14 connected by electric leads 13 to the deflector, and a parallel detector 15. The preferred deflector 12 is a pair of electrostatic deflecting plates, and the preferred power supply 14 charges the two plates to equal but opposite voltages to produce a deflection of an electron beam 11. The electron beam, which is dispersed according to the energy of the electrons, may thereby be deflected to a range of positions, including a position 17 such that the beam is incident on an active area 16 of the detector 15, and positions 18 and 19 such that the electron beam falls outside the active area 16. The preferred parallel detector 15 contains a large number of independent detection channels, each of which is elongated in the direction perpendicular to the direction of the energy dispersion so as to relax the requirements for precise focussing of the electron beam in that direction. The preferred orientation of the deflector 12 is such that the direction of the deflection is perpendicular to the dispersion direction, so that while the electron beam is swept across the active area of the detector, electrons of a particular energy are always incident on one and the same detector element.

Figure 2:
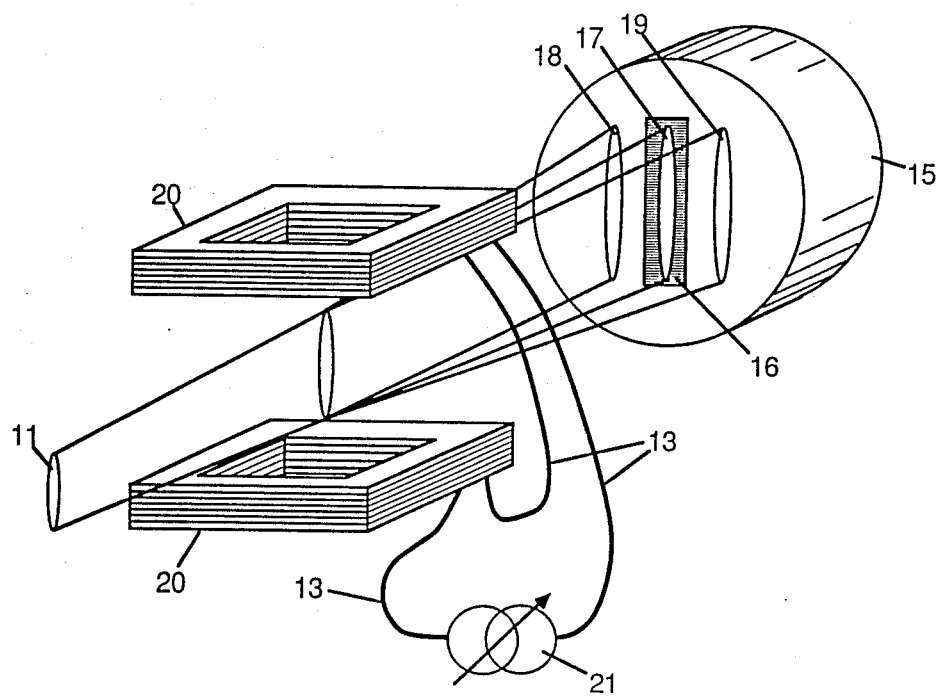
FIG. 2 shows a perspective view of an attenuator in which the deflector is an electromagnetic dipole.

FIG. 2 shows a second practical form of the attenuator in which the deflector comprises an electromagnetic dipole comprising coils 20 connected by electric leads 13 to a power supply 21 which energizes the coils such that their north poles point in the same direction.

Figure 3:
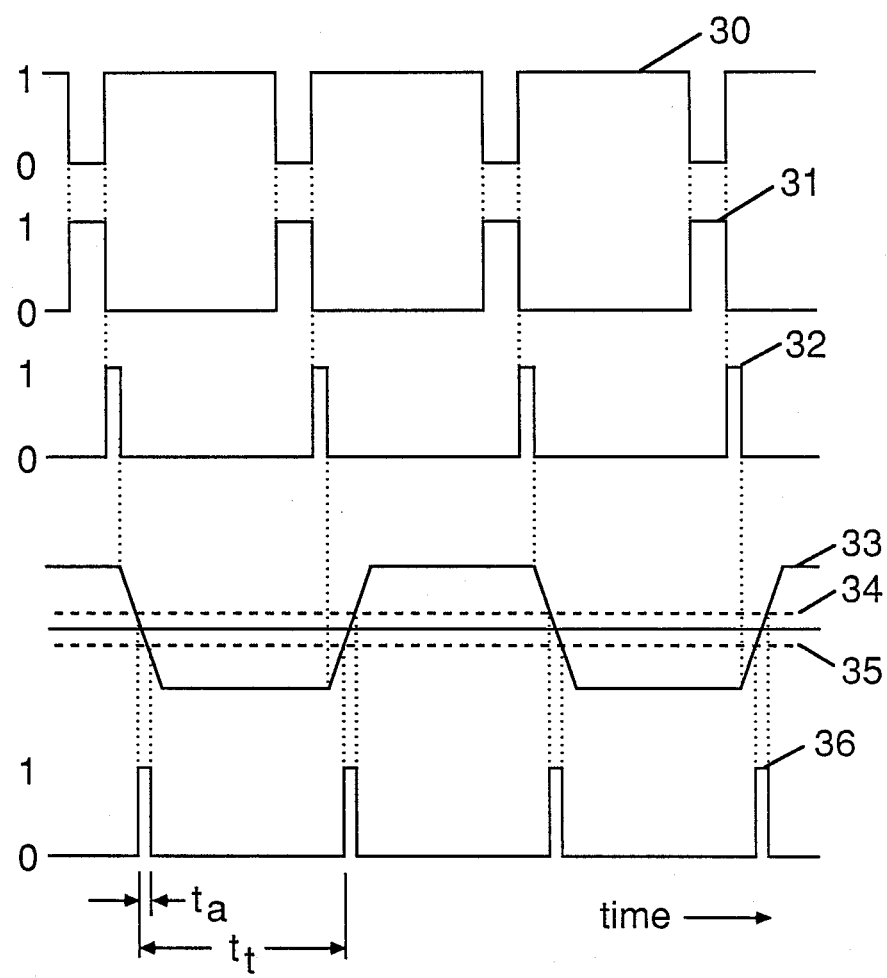
FIG. 3 shows a schematic diagram of the timing of the operation of the attenuator in relation to the timing of the electron detector.

FIG. 3 shows how the power supplies 14 or 21 are controlled so that a variable attenuation of the intensity of the electron beam falling on the active area of the detector is achieved. Trace 30 denotes the accumulation periods of the detector, trace 31 denotes read-out periods of the detector, trace 32 shows timing pulses which indicate the end of each read-out period, trace 33 shows the voltage (or current) applied to the deflector, and trace 36 shows the times at which the parallel detector is exposed to the electron beam. The parallel detector is alternately either accumulating an electron energy spectrum, shown by trace 30 going high, or is reading the spectrum out, shown by trace 31 going high. If the electron beam falls onto the detector during the read-out interval, a part of the spectrum will typically be read out immediately, but the remainder will only be read out in the following read-out, or may be lost altogether. Hence it is desirable to synchronize the attenuator operation with the read-out cycles of the detector. This is accomplished by providing a short pulse 32 marking the end of each read-out period, and triggering the power supply of the deflector such that on the falling edge of the pulse 32 the voltage (or current) supplied to the deflector begins to switch from one extreme value to the other, as shown by the trace 33. The magnitude of the extreme voltage (or current) supplied to the deflector is chosen so that the electron beam is deflected clear of the active area 16 of the detector shown in FIGS. 1 and 2. On passing from one extreme position to the other, the electron beam crosses briefly the active area of the detector. The crossing occurs while the voltage (or current) supplied to deflector is between a lower and upper threshold value marked by straight lines 34 and 35. During the corresponding time interval $t_a$ the detector intercepts the oncoming electron beam, as is shown by trace 36. The intensity of the oncoming electron beam is thereby attenuated by a factor equal to the ratio $t_a/t_t$, where $t_t$ is the total time length of one detector cycle consisting of an accumulation period and a read-out period. The attenuation factor may be varied either by adjusting the time $t_a$, for instance by adjusting the change rate of the voltage (or current) produced by the power supply supplying the deflector, or by changing the length of the detector cycle $t_t$.

Figure 4:
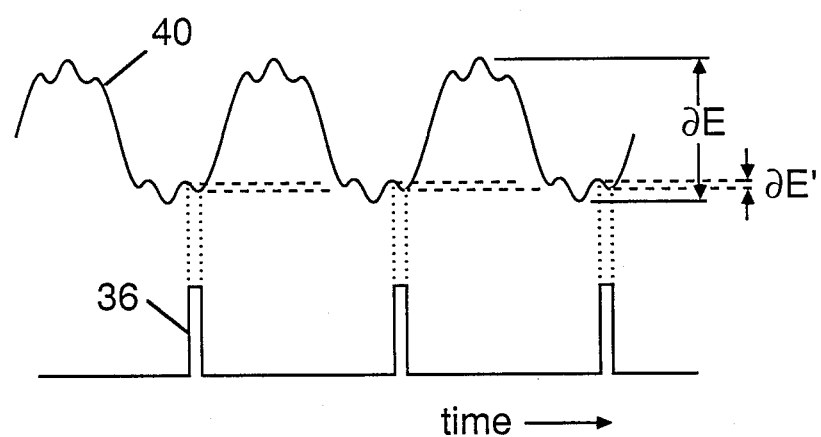
FIG. 4 shows a diagram illustrating how the operation of the attenuator improves the energy resolution of the electron spectrometer.

FIG. 4 shows how the action of the electron beam attenuator improves the energy resolution of an electron spectrometer. Trace 40 represents the displacement of the spectrum on the detector in the energy dispersion direction, as a function of time. Displacements of this type arise when the primary energy of the electron beam changes, the power supplied to the energy-dispersing element contains a small amount of ripple, or when stray AC magnetic fields penetrate inside the electron beam flight tube. The displacement can conveniently be calibrated in terms of the shift of the spectrum in energy, whereby the displacement represented by the trace 40 results in a loss of energy resolution $\partial E$. The principal part of the displacement is usually synchronous with mains powers frequency, or a multiple of the mains power frequency. The displacement can be minimized by careful design of the power supplies and of the spectrometer stray magnetic field shielding, but it usually remains one of the principal causes of decreased energy resolution when the primary beam energy is greater than about 100 keV. Trace 36 represents the active periods of the detector during which the incident spectrum is being detected when the attenuator is switched on. During each short active period the displacement of the spectrum is reduced to an amount represented by $\partial E'$, thus reducing the deterioration of the energy resolution due to instrumental instabilities in each single spectrum. If the active periods are synchronized with the dominant frequency of the spectrum displacement, adding sequentially acquired spectra (to improve the signal-to-noise ratio of the spectrum) will not appreciably worsen the energy resolution. Alternately, if the displacement is mainly aperiodic, loss of energy resolution is a spectrum formed by adding several successive spectra can be minimized by a data acquisition computer which examines the energy shifts of the most prominent features of the spectrum, and shifts the spectra correspondingly before they are added to the cumulative total.

Figure 5:
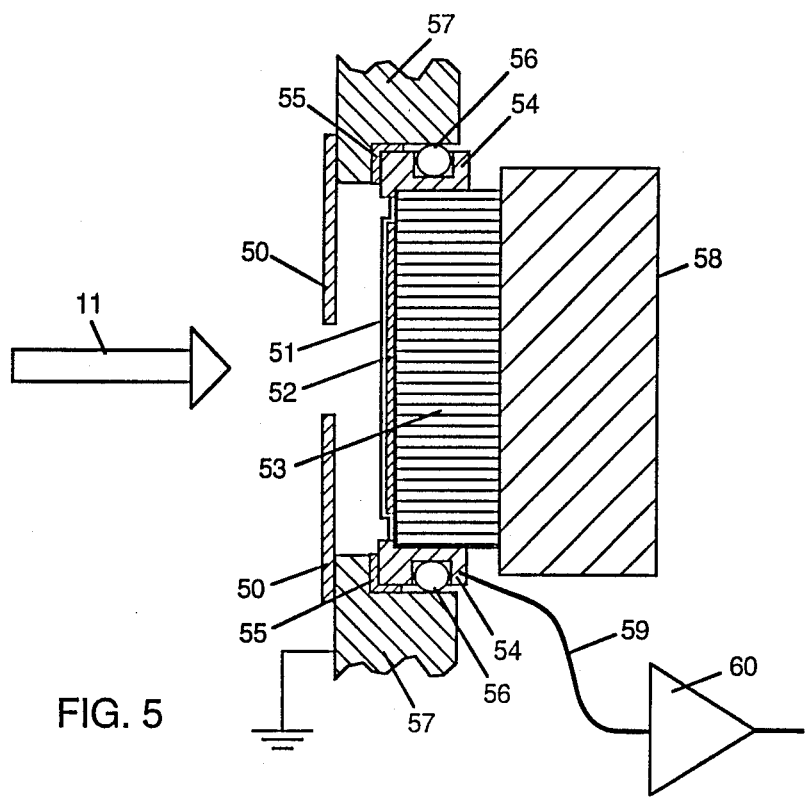
FIG. 5 shows a cross-section view of a parallel electron detector incorporating an electron current sensor.

FIG. 5 shows a preferred configuration of the parallel detector, comprising an electrically grounded electron shield 50 which includes an aperture whose size defines the active area of the detector, a thin electron scintillator 52 attached to a fiber-optic plate 53 and coated with an electron-transparent conducting coating 51. The fiber-optic plate transfers the light image created on the scintillator by incident electron beam 11 to a one-dimensional or two-dimensional light detector 58, such as a photodiode array or a charge-coupled device array with a fiber-optic front end. The fiber-optic plate 53 is mounted inside the conducting sleeve 54, and the conducting sleeve is electrically isolated from an electrically grounded wall 57 by an insulating sleeve 55 and an "O"-ring 56, which may also form a vacuum barrier. An electrical lead 59 is connected to the conducting sleeve 54 and through the sleeve to the conducting coating 51. The fiber optic plate 53 is electrically insulating. Any portion of the electron beam 11 which passes through the aperture in the electron shield 50 and impinges on the scintillator therefore gives rise to an electric current through the lead 59, which is sensed by the amplifier 60. The output of the amplifier is connected to a threshold circuit which is in turn connected to the attenuator electronics in such manner that when the intensity of the electron beam admitted through the aperture in the shield 50 exceeds a pre-determined threshold, the electron attenuator is automatically activated, thereby reducing the time-averaged intensity of the electron beam reaching the active area of the detector.

Figure 6:
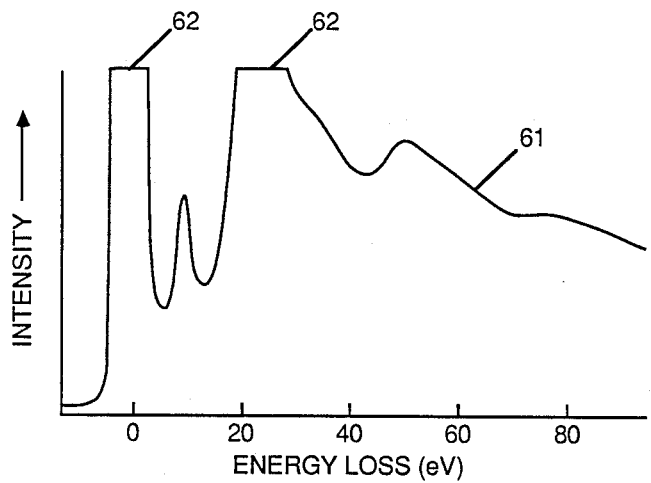
FIG. 6 shows an electron energy-loss spectrum acquired with the attenuator switched off.
Figure 7:
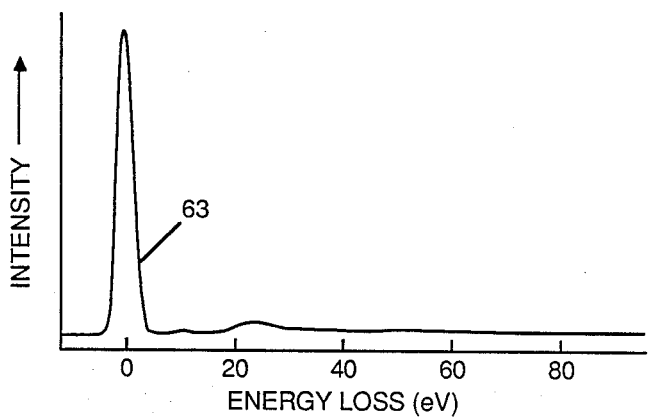

FIGS. 6 and 7 show a pair of electron energy-loss spectra acquired from a thin specimen of boron nitride with the apparatus of the invention at a total electron beam current of about 1 nA, which is typical for electron energy-loss spectroscopy carried out in a transmission electron microscope. Spectrum 61 of FIG. 6 was acquired with the attenuator switched off, in the shortest possible detector cycle time $t_t$ of 25 msec, as determined by the read-out electronics associated with a 1024-channel linear photodiode array used as the parallel detector. The zero loss peak and the intense feature of 23 eV energy loss (the first plasmon) in the spectrum both exceeded the saturation threshold level 62 of the detector. Spectrum 63 of FIG. 7 was acquired with the attenuator switched on, the detector cycle lengthened to 500 msec, and an active time $t_a$ of 0.5 msec. Switching the attenuator on reduced the intensity of the recorded spectrum approximately 50 times compared to the unattenuated spectrum, and no feature in the spectrum saturated the detector. Equally importantly, the exposure time of the electron scintillator to the zero loss beam was reduced by a factor of 100 (500/0.5) compared to a continuous exposure.

While the above contains many specificities, the reader should not construe these as limitations on the scope of the invention, but merely as exemplifications of the preferred embodiment thereof. Those skilled in the art will envision many other possible variations within its scope. For example, it will be apparent to those skilled in the art that the electron beam could be dispersed into an electron image or an electron diffraction pattern rather than into an energy spectrum, without affecting the requirements placed on the attenuator. Further, the electron beam could be deflected in a direction other than perpendicular to the dispersion direction, provided that the deflector power supply is made to deflect the beam very rapidly onto the active area of the detector, leave it stationary for a short time, and then very rapidly sweep it away. Similarly, the intensity of the electron beam incident on the parallel detector could be sensed by the parallel detector itself, and the automatic protection of the detector could be configured such that the electron beam is deflected away whenever the signal collected by the detector exceeds a pre-determined threshold. Likewise, instead of activating the attenuator, the radiation damage prevention could be achieved by permanently deflecting the electron beam away from the detector whenever the intensity of the incident beam exceeds the safe threshold, and alerting the operator, for instance by an audio warning, that the beam intensity should be reduced or the attenuator activated before the deflection is disabled.

What is claimed is:

1. A variable-attenuation parallel detector unit comprising:
   a parallel detector including a plurality of individual detector elements each detecting a small portion of an electron spectrum;
   electron beam deflector capable of directing said spectrum onto said parallel detector and away from said detector;
   electronic read-out means reading out the signal accumulated on said parallel detector at period intervals; and
   electronic control means synchronizing the action of said deflector with said read-out means such that said electron spectrum is deflected away from said parallel detector while the signal accumulated on the detector is read out, and the spectrum is briefly brought onto the parallel detector between the periodic read-outs, whereby varying the ratio of the time interval during which the spectrum is deflected onto the parallel detector to the time interval between successive read-outs of the parallel detector results in an attenuation of the intensity of the detected electron spectrum by a variable factor.

2. An apparatus as claimed in claim 1 in which said electron beam deflector is an electrostatic deflector.

3. An apparatus as claimed in claim 1 in which said electron beam deflector is an electromagnetic deflector.

4. An apparatus as claimed in claim 1 in which said parallel detector comprises an electron scintillator coupled to a photodiode array.

5. An apparatus as claimed in claim 1 in which said parallel detector comprises an electron scintillator coupled to a charge-coupled device array.

6. An apparatus as claimed in claim 1 further comprising a sensor detecting the intensity of the electron spectrum incident on the parallel detector, and an electronic means activating said electron beam deflector whenever said intensity exceeds a predetermined threshold, thereby decreasing the exposure of the parallel detector to the electron spectrum, and avoiding radiation damage to the detector.

7. A variable-attenuation parallel detector unit comprising:
   a parallel detector including a plurality of individual detector elements each detecting a small portion of an electron spectrum;
   electron beam deflector capable of directing said spectrum onto said parallel detector and away from said detector;
   electronic read-out means reading out the signal accumulated on said parallel detector at periodic intervals;
   electronic control means synchronizing the action of said deflector with said read-out means such that said electron spectrum is deflected away from said parallel detector while the signal accumulated on the detector is read out, and said spectrum is briefly brought onto the detector between the periodic read-outs; and
   further electronic control means synchronizing said read-out means and said deflector with a principal periodic component of a displacement of said spectrum in the energy dispersion direction, thereby minimizing a loss of energy resolution in a spectrum obtained by adding several successive spectra to a cumulative total.

8. A variable-attenuation parallel detector unit comprising:
   a parallel detector including a plurality of individual detector elements each detecting a small portion of an electron spectrum;
   electron beam deflector capable of directing said spectrum onto said parallel detector and away from said detector;
   electronic read-out means reading out the signal accumulated on said parallel detector at periodic intervals;
   electronic control means synchronizing the action of said deflector with said read-out means such that said electron spectrum is deflected away from said parallel detector while the signal accumulated on the detector is read out, and said spectrum is briefly brought onto the detector between the periodic read-outs;
   means for assessing the energy shift of principal features in electron spectra acquired successively; and
   means for correcting said shift before spectra are added together to form a cumulative total, thereby minimizing a loss of energy resolution in the cumulative spectrum.

9. An apparatus as claimed in claim 8 in which said means for detecting said energy shift is an electronic computer provided with suitable spectrum shift-detecting software.

10. An apparatus as claimed in claim 8 in which said means for correcting said energy shift is an electronic computer provided with suitable spectrum shifting software.

* * * * *